(12) United States Patent
Lee et al.

(10) Patent No.: US 9,064,673 B2
(45) Date of Patent: Jun. 23, 2015

(54) WORKPIECE CARRIER

(71) Applicant: Axcelis Technologies, Inc., Beverly, MA (US)

(72) Inventors: William Davis Lee, Newburyport, MA (US); Kevin J. Hoyt, Sandown, NH (US); David Shanner, Georgetown, MA (US); Jason Beringer, Danvers, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 42 days.

(21) Appl. No.: 13/915,149

(22) Filed: Jun. 11, 2013

(65) Prior Publication Data

US 2014/0361197 A1    Dec. 11, 2014

Related U.S. Application Data

(60) Provisional application No. 61/658,865, filed on Jun. 12, 2012.

(51) Int. Cl.
| | |
|---|---|
| *H01L 21/673* | (2006.01) |
| *H01J 37/20* | (2006.01) |
| *H01J 37/317* | (2006.01) |
| *H01L 21/687* | (2006.01) |
| *H01L 21/683* | (2006.01) |

(52) U.S. Cl.
CPC .............. *H01J 37/20* (2013.01); *H01J 37/3171* (2013.01); *H01L 21/6831* (2013.01); *Y10S 901/31* (2013.01); *H01J 2237/08* (2013.01); *H01J 2237/2007* (2013.01); *H01J 2237/201* (2013.01); *H01L 21/68785* (2013.01)

(58) Field of Classification Search
USPC .................................................. 250/442.11
See application file for complete search history.

(56) References Cited

U.S. PATENT DOCUMENTS

| 7,854,327 | B2 * | 12/2010 | Hyobu | 206/710 |
| 2011/0159200 | A1 * | 6/2011 | Kogure | 427/458 |
| 2012/0193216 | A1 * | 8/2012 | Endo et al. | 204/192.1 |

* cited by examiner

*Primary Examiner* — Kiet T Nguyen
(74) *Attorney, Agent, or Firm* — Eschweiler & Associates, LLC

(57) ABSTRACT

A workpiece carrier comprises a first plate having a first outer diameter, a first inner diameter, and a first recess extending a first distance from the first inner diameter toward the first outer diameter. The workpiece carrier further comprises a second plate having a second outer diameter, a second inner diameter, and a second recess extending a second distance from the second inner diameter toward the second outer diameter. A plurality of mating features associated with the first plate and second plate are configured to selectively fix a position of a first workpiece between the first plate and second plate within the first recess and second recess.

30 Claims, 13 Drawing Sheets

WORKPIECE CARRIER

REFERENCE TO RELATED APPLICATION

This application claims priority to and the benefit of U.S. Provisional Application Ser. No. 61/658,865 which was filed Jun. 12, 2012, entitled "WORKPIECE CARRIER", the entirety of which is hereby incorporated by reference as if fully set forth herein.

TECHNICAL FIELD

The present disclosure relates generally to workpiece carriers and more specifically to carriers for handling various-sized wafers in an ion implantation system.

BACKGROUND

Electrostatic clamps or chucks (ESCs) are often utilized in the semiconductor industry for clamping workpieces or substrates during plasma-based or vacuum-based semiconductor processes such as ion implantation, etching, chemical vapor deposition (CVD), etc. Conventionally, a semiconductor processing system and associated ESC is designed to clamp one particularly-sized workpiece. Processing a workpiece of a different size than was designed for, however, can introduce various problems, such as redesigning of workpiece handling components, ESCs, and other processing equipment. Accompanying costs and system downtime are typical when changing workpiece size in a semiconductor processing system, wherein substantial alterations of handling equipment, ESCs, and other processing equipment and methods have been conventionally needed. Further, if the process is to be run at high temperature, additional requirements are placed on the system.

SUMMARY

A need has been determined for processing a workpiece of one size on an ESC designed for a differently-sized workpiece in various semiconductor processing systems. The present disclosure details a workpiece carrier for securing various-sized workpieces, wherein the workpiece carrier is easy to use, suitable to be run at high temperatures, and can provide a cost-effective solution to the various modifications of equipment seen in the prior art.

The present invention overcomes the limitations of the prior art by providing a system, apparatus, and method for handling and processing various-sized workpieces in a semiconductor processing system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

A workpiece carrier is provided comprising a first plate having a first outer diameter, a first inner diameter, and a first recess extending a first distance from the first inner diameter toward the first outer diameter. The workpiece carrier further comprises a second plate having a second outer diameter, a second inner diameter, and a second recess extending a second distance from the second inner diameter toward the second outer diameter. A plurality of mating features associated with the first plate and second plate are configured to selectively fix a position of a first workpiece between the first plate and second plate within the first recess and second recess. The plurality of mating features may comprise ears, grooves, pins, holes, and/or slots.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
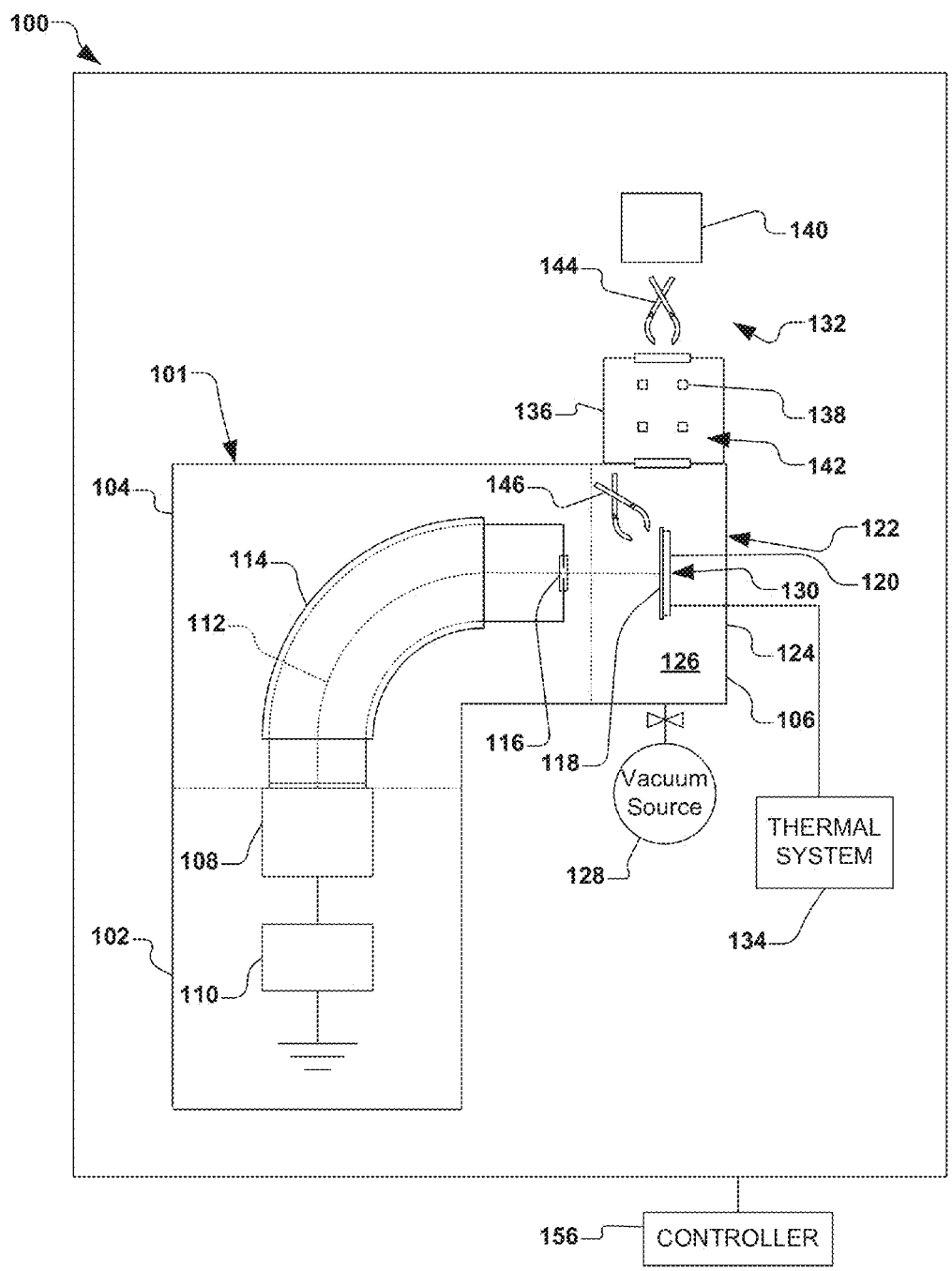
FIG. 1 is a block diagram of an exemplary vacuum system comprising an ion implantation system in accordance with several aspects of the present disclosure.

The present disclosure is directed generally toward a system, apparatus, and method for handling and processing various-sized workpieces in a semiconductor processing system. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In accordance with one aspect of the present disclosure, FIG. 1 illustrates an exemplary processing system 100. The processing system 100 in the present example comprises an ion implantation system 101, however various other types of processing systems are also contemplated, such as plasma processing systems, reactive ion etching (RIE) systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

During an implantation utilizing the ion implantation system 101, energy can build up on the workpiece 118 in the form of heat, as the charged ions collide with the workpiece. Absent countermeasures, such heat can potentially warp or crack the workpiece 118, which may render the workpiece worthless (or significantly less valuable) in some implementations. The heat can further cause the dose of ions delivered to the workpiece 118 to differ from the dosage desired, which can alter functionality from what is desired. For example, if a dose of $1\times10^{17}$ atoms/cm$^2$ are desired to be implanted in an extremely thin region just below the outer surface of the workpiece 118, undesirable heating could cause the delivered ions to diffuse out from this extremely thin region such that the dosage actually achieved is less than $1\times10^{17}$ atoms/cm$^2$. In effect, the undesirable heating can "smear" the implanted charge over a larger region than desired, thereby reducing the effective dosage to less than what is desired. Other undesirable effects could also occur from the undesirable heating of the workpiece 118. It may be further desirable to implant ions at a temperature below or above an ambient temperature, such as to allow for desirable amorphization of the surface of the workpiece 118 enabling ultra shallow junction formation in advanced CMOS integrated circuit device manufacturing. In such cases, cooling of the workpiece 118 is desirable. In other circumstances, it is desirable to further heat the workpiece 118 during implantation or other processing in order to aid in processing (e.g., such as a high-temperature implantation into silicon carbide).

Thus, in accordance with another example, the chuck 120 comprises a controlled temperature chuck 130, wherein the controlled temperature chuck is configured to both support the workpiece and to selectively cool, heat, or otherwise maintain a predetermined temperature on the workpiece 118 within the process chamber 122 during the exposure of the workpiece to the ion beam 112. As such, it should be noted that the controlled temperature chuck 130 in the present example can comprise a sub-ambient temperature chuck configured to support and cool the workpiece 118, or a super-ambient temperature chuck configured to support and heat the workpiece within the process chamber 122. In another example, the controlled-temperature chuck 130 can provide no heating or cooling to the workpiece.

The controlled temperature chuck 130, for example, comprises an electrostatic chuck configured to cool or heat the workpiece 118 to a processing temperature that is considerably lower or higher than an ambient or atmospheric temperature of the surroundings or external environment 132 (e.g., also called an "atmospheric environment"), respectively. A thermal system 134 may be further provided, wherein, in another example, the thermal system is configured to cool or heat the controlled temperature chuck 130, and thus, the workpiece 118 residing thereon, to the processing temperature.

In accordance with another aspect, referring again to FIG. 1, a load lock chamber 136 is further operably coupled to the process chamber 122, wherein the load lock chamber is configured to isolate the process environment 126 from an external environment 132. The load lock chamber 136 further comprises a workpiece support 138 configured to support the workpiece 118 during a transfer of the workpiece between the process chamber 122 and the external environment 132, such as to and/or from a workpiece transport container 140 (e.g., a FOUP or workpiece cassette) operably associated or coupled with the load lock chamber 122. Accordingly, the load lock chamber 136 maintains the process environment 126 (e.g., a vacuum environment) within the vacuum system 100 by varying a load lock chamber environment 142. A pressure within the load lock chamber 136, for example, is configured to vary between the vacuum associated with the process environment 126 and a pressure associated with the external environment 138.

Further, in accordance with another exemplary aspect, an atmospheric robot 144 is configured to selectively transfer the workpiece 118 between the load lock chamber 122 and the workpiece transport container 142. The workpiece transport container 142, for example, is configured to transfer a plurality of workpieces 118 in the external environment 138, such as to and from the vacuum system 100. A vacuum robot 146 is further configured to selectively transfer the workpiece 118 between the load lock chamber 122 and the chuck 120. Furthermore, a controller 148 is configured to selectively control the movement of the workpiece 118 throughout the vacuum system 100, such as by controlling one or more of the atmospheric robot 144, vacuum robot 146, chuck 120, as well as other components of the vacuum system 100.

The inventors appreciate that utilizing the same vacuum system 100 for processing workpieces 118 having varying sizes (e.g., diameters varying from 100 mm to 300 mm) can be advantageous, and that the processing of such various-sized workpieces can be accommodated by the apparatuses and systems disclosed hereafter. As such, costly equipment changes seen heretofore can be eliminated, and system efficiencies can be achieved by the presently disclosed apparatuses, systems, and methods.

Figure 2:
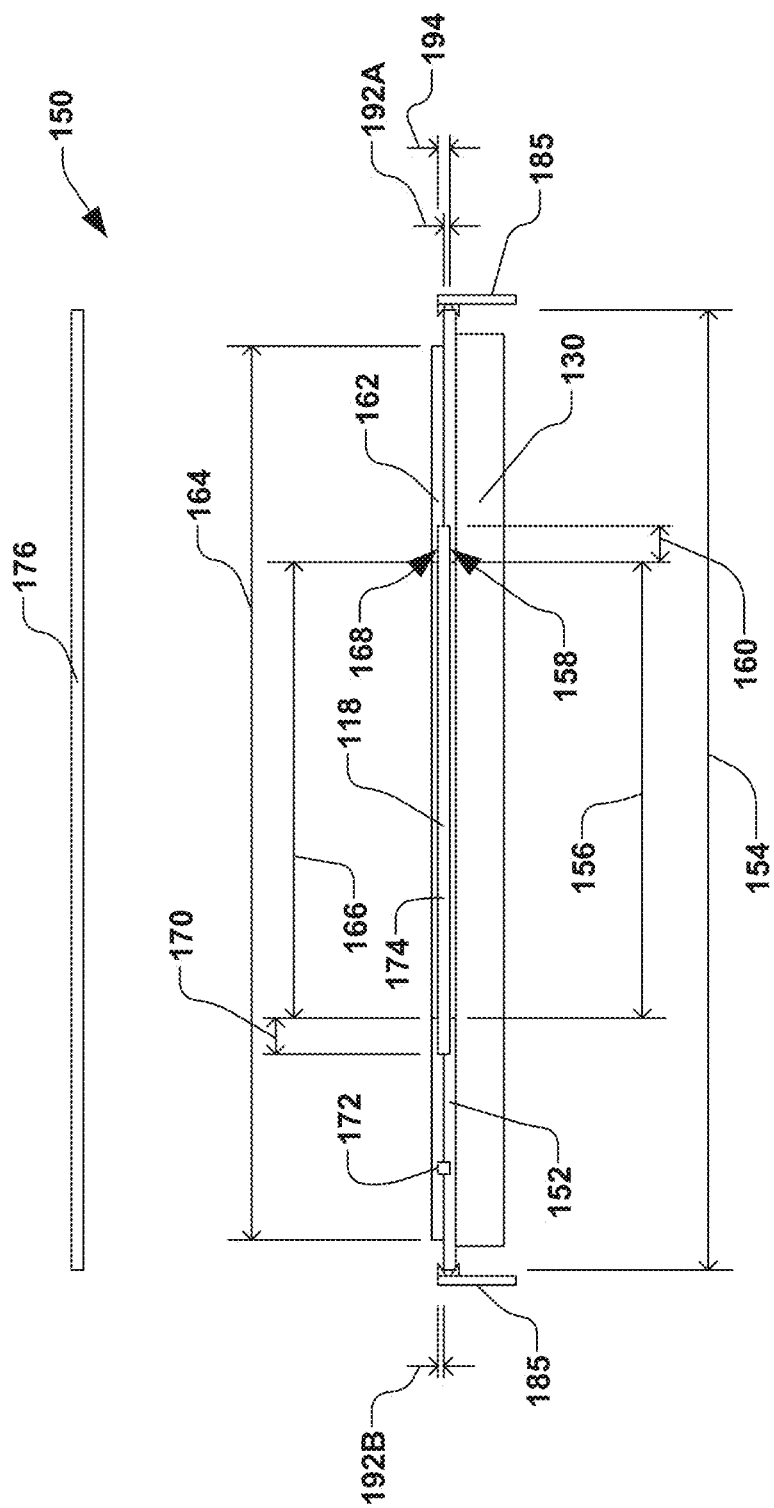
FIG. 2 is a cross-sectional diagram of an exemplary workpiece carrier according to another aspect of the disclosure.
Figure 3:
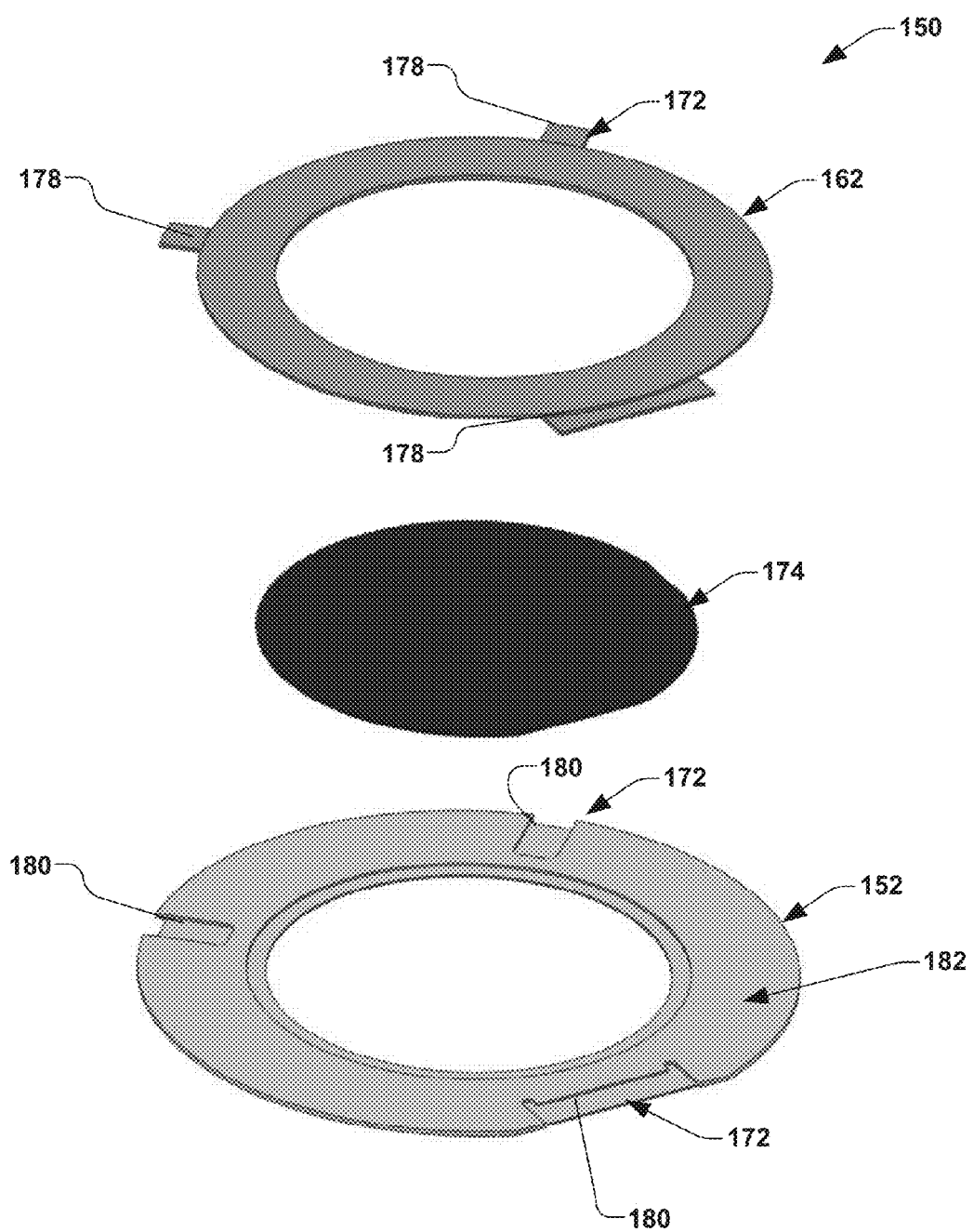
FIG. 3 illustrates an exploded top perspective view of an exemplary workpiece carrier having a plurality of mating features.
Figure 4:
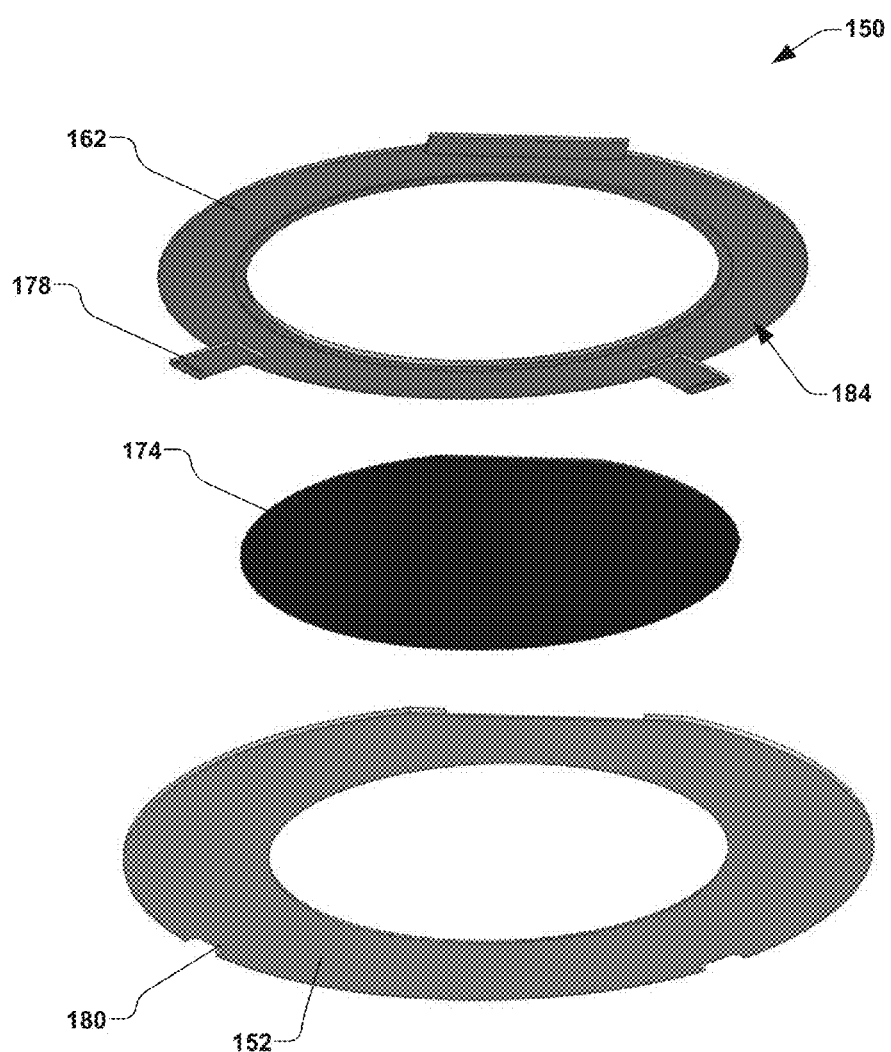
FIG. 4 illustrates an exploded bottom perspective view of the exemplary workpiece carrier of FIG. 3.
Figure 5:
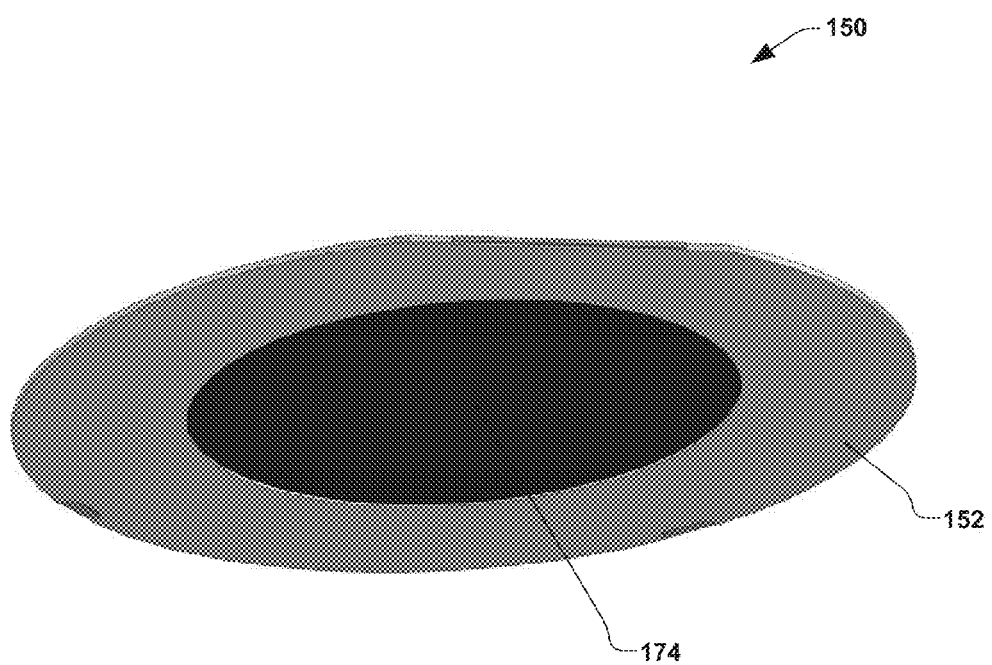
FIG. 5 illustrates a top perspective view of the exemplary workpiece carrier of FIGS. 3-4.
Figure 6:
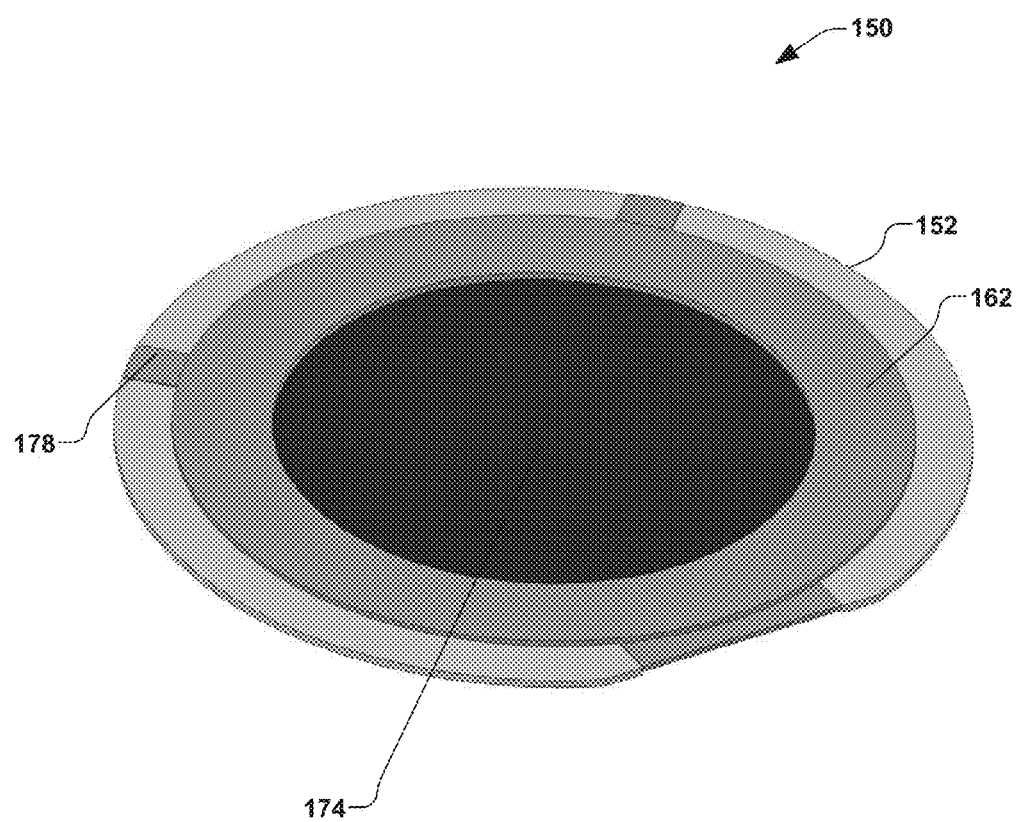
FIG. 6 illustrates a bottom perspective view of the exemplary workpiece carrier of FIGS. 3-5.
Figure 7:
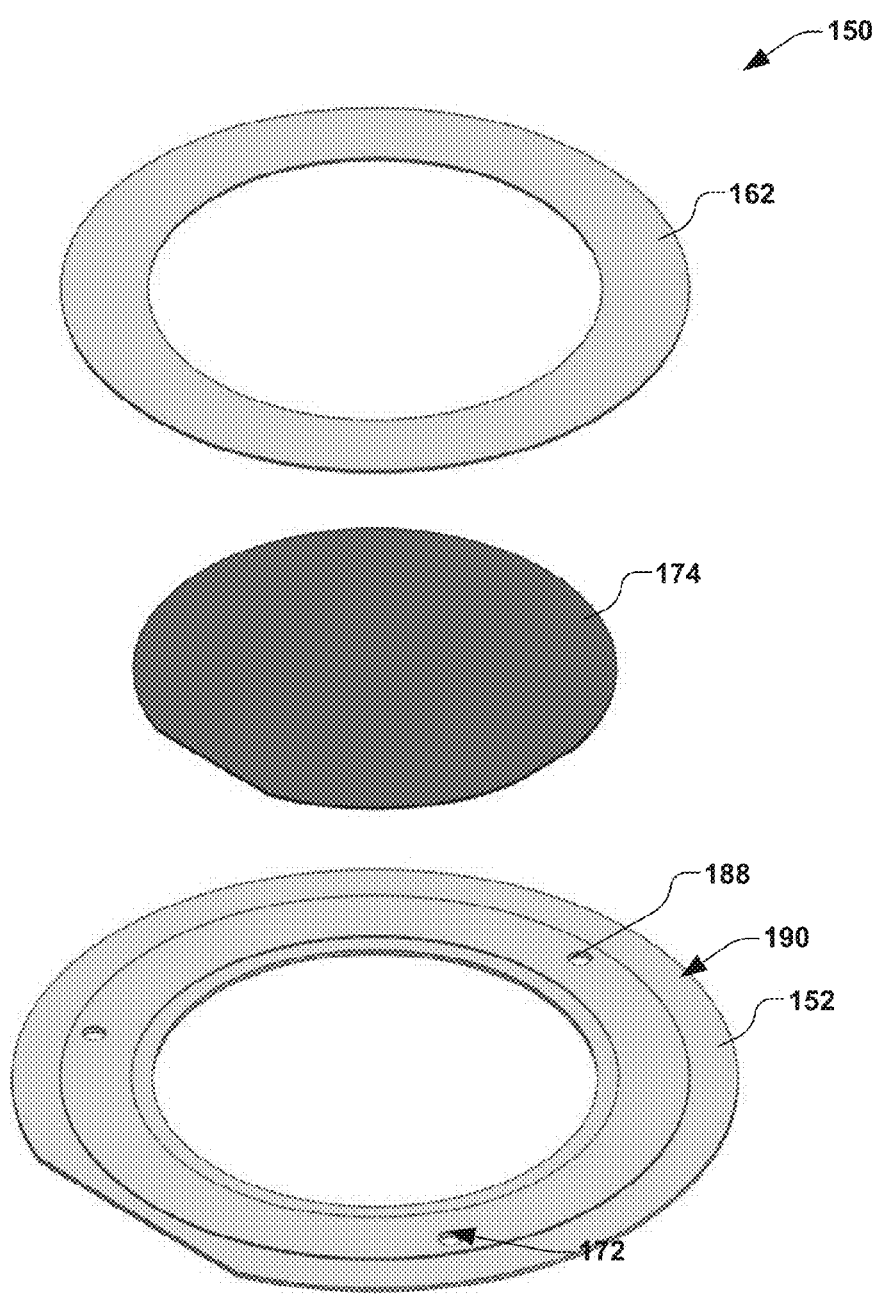
FIG. 7 illustrates an exploded top perspective view of another exemplary workpiece carrier having a plurality of mating features.
Figure 8:
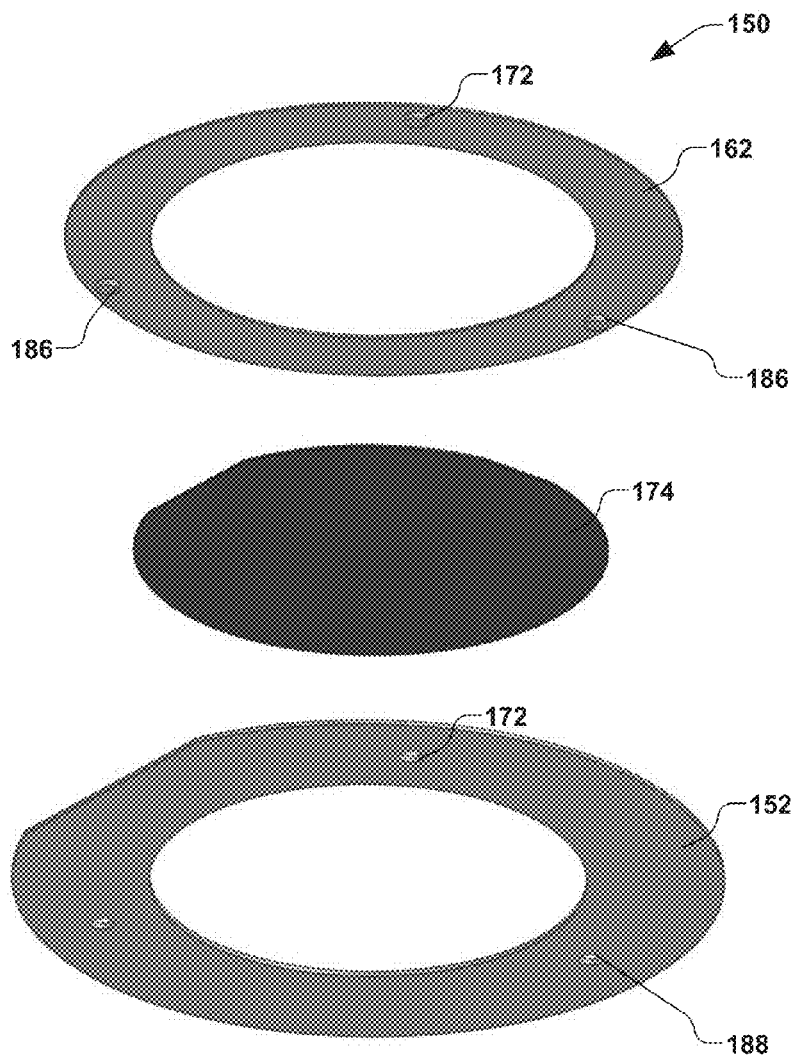
FIG. 8 illustrates an exploded bottom perspective view of the exemplary workpiece carrier of FIG. 7.
Figure 9:
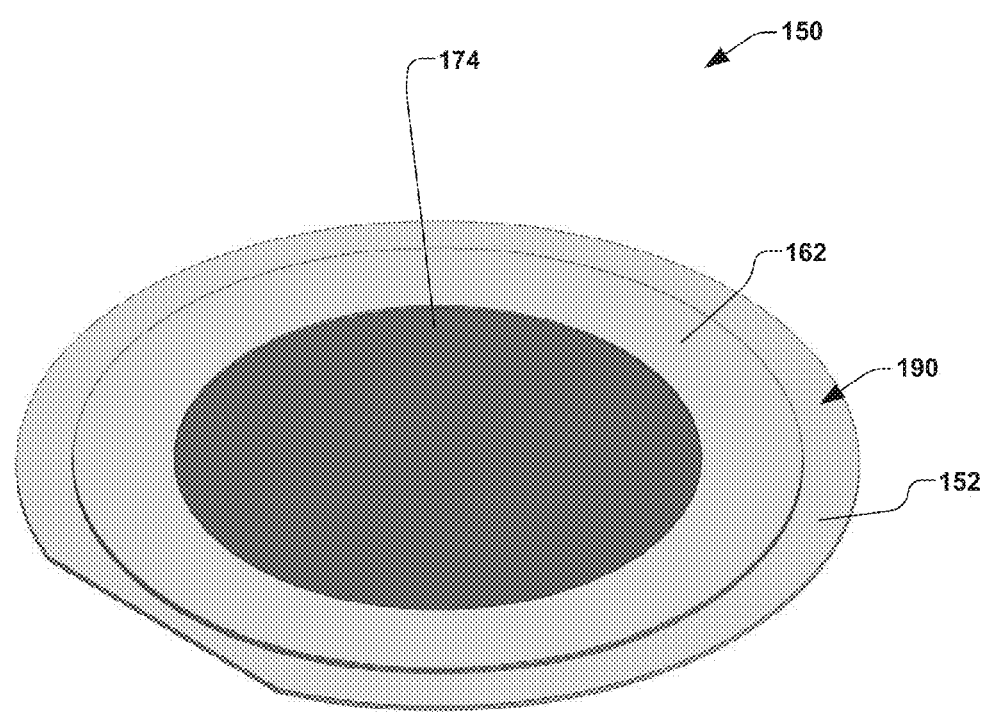
FIG. 9 illustrates a top perspective view of the exemplary workpiece carrier of FIGS. 7-8.
Figure 10:
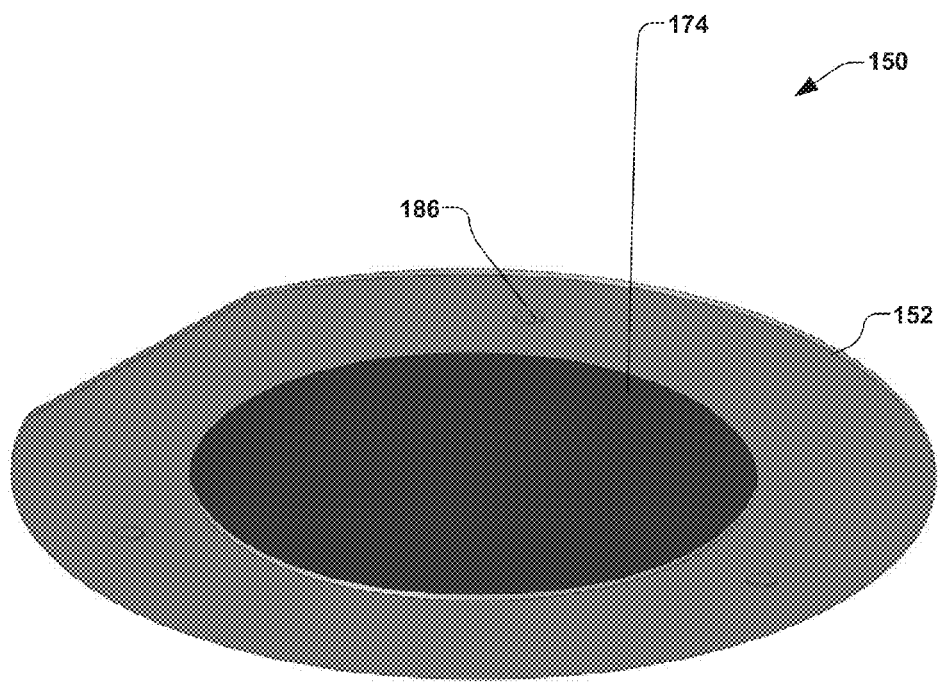
FIG. 10 illustrates a bottom perspective view of the exemplary workpiece carrier of FIGS. 7-9.

In accordance with one exemplary aspect, as illustrated in FIG. 2, a workpiece carrier 150 is provided, wherein the workpiece carrier is configured to hold a 100 mm workpiece on a 150 mm chuck (e.g., the chuck 120 of FIG. 1). It should be noted that while specific diameters and/or sizes of workpieces 118 are described, these diameters and/or sizes are not intended to limit the scope of the present disclosure, and that the present disclosure can be extended to various other sizes of chucks 120 and workpieces 118.

In one example, the workpiece carrier 150 comprises a first plate 152 having a first outer diameter 154, a first inner diameter 156, and a first recess 158 extending a first distance 160 from the first inner diameter toward the first outer diameter. A second plate 162 is further provided, wherein the second plate has a second outer diameter 164, a second inner diameter 166, and a second recess 168 extending a second distance 170 from the second inner diameter toward the second outer diameter.

In accordance with one example, a plurality of mating features 172 are further associated with the first plate 152 and second plate 162, wherein the plurality of mating features are configured to selectively fix a position of a first workpiece 174 between the first plate and second plate within the first recess 158 and second recess 168.

In accordance with another example, the first outer diameter 154 of the first plate 152 is associated with (e.g., equal to) a diameter of a second workpiece 176, and wherein a diameter of the first workpiece 174 is less than the diameter of the second workpiece. For example, the diameter of the first workpiece 174 is approximately 100 mm and the diameter of the second workpiece 176 is approximately 150 mm.

According to one example, as illustrated in FIGS. 3-6, the plurality of mating features 172 comprise a plurality of ears 178 extending from the second outer diameter 164 of the second plate 162, as well as a plurality of slots 180 extending into a top surface 182 of the first plate 152. The plurality of ears 178, for example, extend from a bottom surface 184 of the second plate 162. The plurality of ears 178, for example, may line up with robotic grippers 185 associated with the handling of the workpiece 118, wherein the first and second plates 152 and 162 are both gripped during handling. As illustrated again in FIG. 2, the first plate 152 is configured to be selectively gripped about the first diameter 154 thereof by a robotic gripper 185. In another example, at least a portion (e.g., the ears 178) of the second plate 162 is configured to be selectively gripped about the second diameter 164 thereof by the robotic gripper 185.

According to another example, as illustrated in FIGS. 7-10, the plurality of mating features 172 comprise a plurality of pins 186 extending from the bottom surface 184 of the second plate 162 and a plurality of holes 188 extending into a top surface 190 of the first plate 152. Gravity holds the second plate 162 in place, and the first workpiece 174 is constrained by and interference of the stack of first plate 152, wafer 174, and second plate 162.

The second plate 162, for example, comprises two or more pins 186 that extend down from the bottom surface 184 of the second plate. These pins 186, for example, fit into corresponding holes 188 or slots (not shown) in the first plate 152. The pins 186, for example, may be no longer than the thickness of the first plate 152; thus, they are not able to protrude beyond the bottom surface of the first plate and interfere with clamping. In another example, the pins 186 may be located on the first plate 152, and the second plate 162 would have holes 188 to accept the pins. Such an arrangement could be better at lower temperatures, but might be less desirable at high or very high temperatures as the second plate 162 may heat up more slowly than the first plate 152 and the pins 186 might force the second plate 162 to crack. However, depending on material choice, this may be a good solution.

The first plate 152, for example, may have a step or first recess 158 cut on the inner radius of the through hole, to allow for the first workpiece 174 to reside therein. In one embodiment, this step would be less deep than the thinnest workpiece used. This would insure that when a first workpiece 174 was placed in the carrier 150, the second plate 162 would apply pressure on the first workpiece, therein holding it in place. In another embodiment, the step or first recess 158 would be deeper than the thickest workpiece expected to be used. In such a case, the second plate 162 would have a lip (e.g., second recess 168) that protrudes down sufficiently to again press the first workpiece 174 into the step, insuring the first workpiece is held in place and not likely to move. In both cases, the weight of the top plate may be further utilized to hold the first workpiece 174 in place.

In another example, in order to insert the first workpiece 174 into the workpiece carrier 150 of FIGS. 7-10, the second plate 162 is simply removed, and the first workpiece 175 is placed on the step or first recess 158, and the second plate is again placed on the first plate 152 with the pins 186 engaging the hole 188 in the first plate. To remove the first workpiece 174, the second plate 162 is lifted up, the first workpiece 174 is taken out, and the second plate can be replaced.

In another example, the first distance 106 and second distance 170 of FIG. 2 are associated with an exclusionary zone of the first workpiece 174, wherein semiconductor devices are generally not formed in the exclusionary zone. The first recess 158 of the first plate 152 and second recess 168 of the second plate 158, for example, are configured to contact an exclusionary zone around a perimeter of the first workpiece 174. The first plate 152 and second plate 162, for example, are comprised of one or more of graphite, silicon carbide, alumina, and quartz. The first plate and second plate may be comprised of different materials, or similar materials. Furthermore, there may be an advantageous interference with between the first workpiece 174 and the first and second recesses 158 and 168, respectively. The first plate 152 and second plate 162, for example, are comprised of material that is structurally stable at temperatures greater than approximately 700 C.

In another example, a combination of a depth 192A of the first recess 158 and a depth 192B of the second recess 168 is less than a thickness 194 of the first workpiece 174. In yet another example, a combination of the depth 192A of the first recess 158 and the depth 192B of the second recess 168 is greater than the thickness 194 of the first workpiece 174.

The chuck 130 of FIG. 2, for example, may be mechanical (e.g., mechanical clamping); however, the chuck may alternatively be electrostatic (an ESC) if the workpiece carrier 150 were suitably conductive, so as to clamp properly. The first plate 152 has a hole in the center to allow for line of sight to a heater/chuck below. The second plate 162 also has a hole in it to allow for an ion beam or other process medium to reach the front surface of the wafer or workpiece 118. The holes in both the first and second plates 152 and 162, for example, are smaller than the first workpiece diameter, but large enough so that most of the workpiece can "see" or be exposed to either the chuck below, or the ion beam on the front side (e.g., not excluding more than the edge exclusion zone). These holes in the first and second plates 152 and 162 may be completely round, or include features to align the wafer flat or notch.

The workpiece carrier 150, for example, is intended for holding 100 mm wafers on a 150 mm chuck 130. The first and second plates 152 and 162, for example, may have complementary shapes. The second plate 162 would have an annulus with "wings", and the bottom plate 152 would be another annulus with notches to accept the wings of the top plate. The first and second plates 152 and 162 (e.g., respective top and bottom plates) would sit such that the "wings" or ears 178 on the top plate would sit in the corresponding notches on the bottom plate. The two plates 152 and 162 would sit in-plane, forming a complete and uniform carrier surface. Additionally, one of the notches in the bottom plate could be under cut, to allow a mating feature in the top plate to fit in and hold the top plate in place.

While on the clamp 130, whether mechanical or electrostatic, the wings or ears 178 from the top plate would be held in place by the clamp structure. In turn, the workpiece 174 and the first plate 152 are clamped down.

To insert a wafer or workpiece into the workpiece carrier 150, the second plate 162 (the top plate) is lifted and pivoted up, hinging around the undercut surface. The top plate can be removed. The workpiece is then placed in the first recess 158, and the second plate 162 is again placed on the first plate 152, first catching the undercut, then hinging down into place. The combination of the wings or ears 178 in their notches and the undercut surface act to securely hold the first workpiece 174 in place. To remove the first workpiece 174, the second plate 162 is again lifted and pivoted up, the workpiece is taken out, and the second plate 162 can be replaced.

Figure 11:
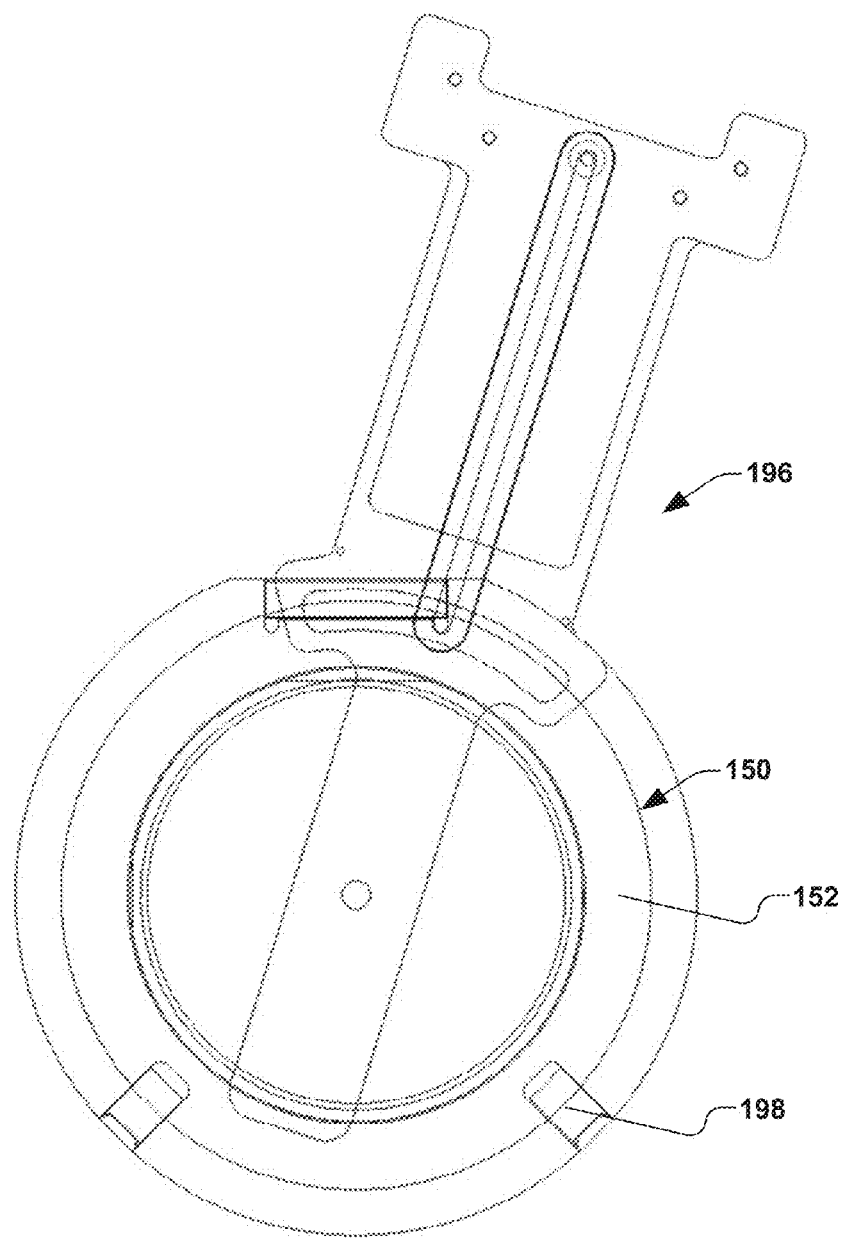
FIGS. 11-12 illustrate exemplary gripper mechanisms in conjunction with the workpiece carrier of the present disclosure.
Figure 12:
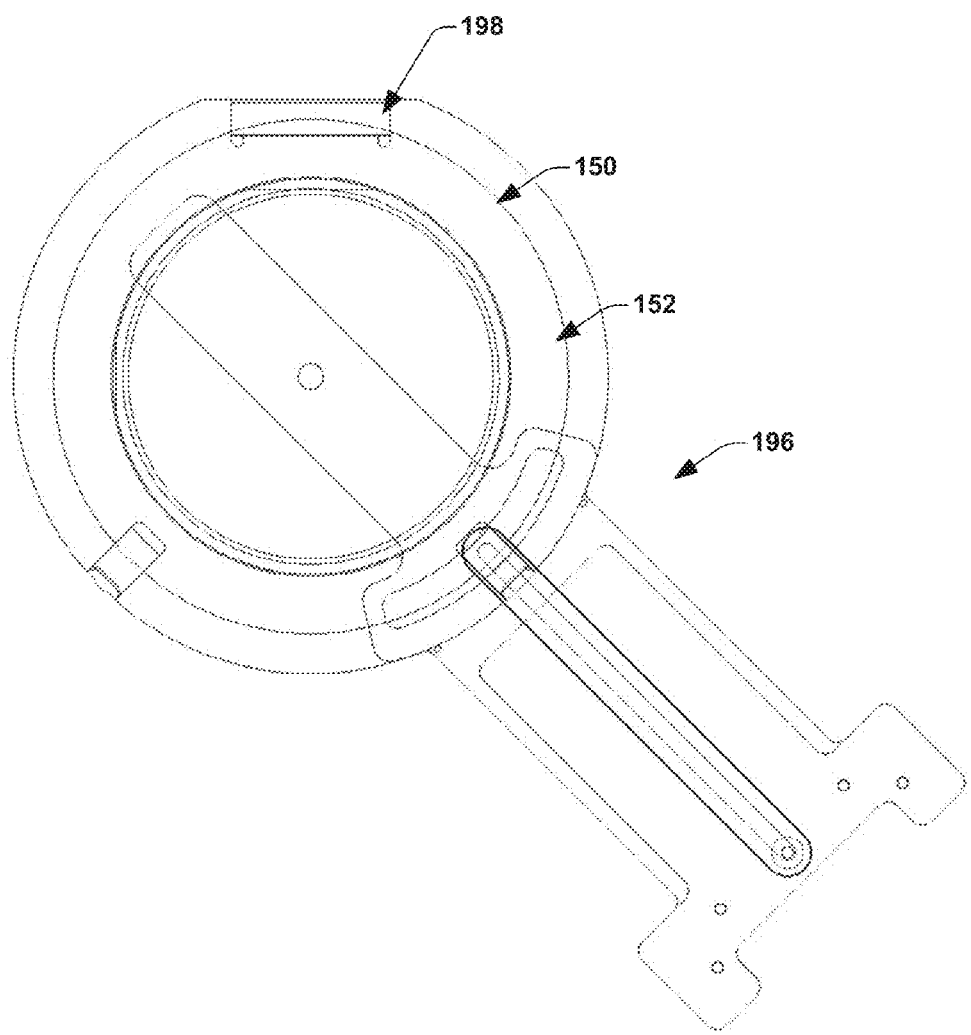

FIGS. 11 and 12 illustrate several views of an exemplary workpiece carrier 150 being gripped by a gripper robot 196, wherein the gripper robot grips at least the first plate 152 by one or more grippers 198, as described above.

Figure 13:
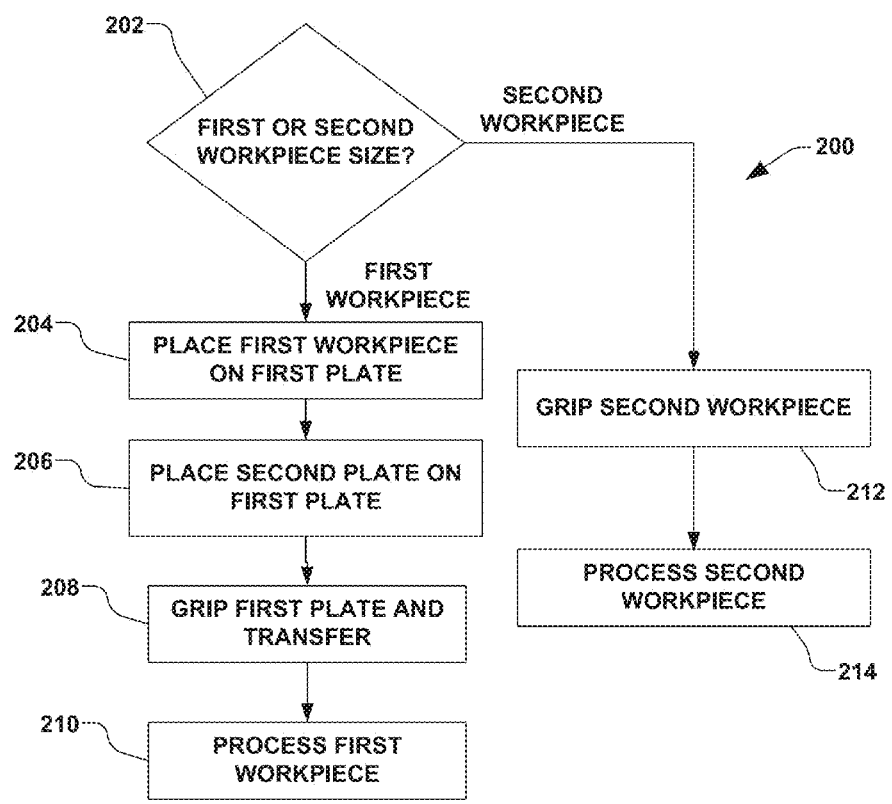
FIG. 13 illustrates a methodology for processing multiple-sized workpieces, in accordance with still another aspect.

In accordance with yet another exemplary aspect of the invention, FIG. 13 illustrates an exemplary method 200 is provided for selectively gripping and processing a first and second workpiece having different diameters. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 13 begins at act 202, wherein it is determined whether a first workpiece or a second workpiece is to be processed. in the present example, a diameter of the first workpiece is less than a diameter of the second workpiece. in act 204, the first workpiece is positioned in a first recess of a first plate when the first workpiece is to be processed, wherein the first plate has a first outer diameter associated with a diameter of the second workpiece, and wherein the first plate has a first inner diameter, wherein the first recess extends a first distance from the first inner diameter toward the first outer diameter. In act 206, a second plate is positioned over the first plate, the second plate having a second outer diameter, a second inner diameter, and a second recess extending a second distance from the second inner diameter toward the second outer diameter, wherein a position of the first workpiece is generally fixed between the first plate and second plate within the first recess and second recess, and wherein a plurality of mating features associated with the first plate and second plate further selectively fix the position of the first workpiece between the first plate and second plate. In act 208, the first outer diameter of the first plate is gripped, and the first workpiece is subsequently processed in act 210.

If the determination made in act 202 is such that a second workpiece having a larger diameter is to be processed, a perimeter of the second workpiece is gripped in act 212 and the second workpiece is subsequently processed in act 214.

In one example, one of the first plate and second workpiece may be subsequently transferred to a chuck positioned within a process chamber, based on whether the first workpiece or second workpiece is to be processed. Selectively gripping the one of the first plate and second workpiece via the chuck, for example, may comprise electrostatically or mechanically gripping the one of the first plate and second workpiece to the chuck.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A workpiece carrier, comprising:
a first plate having a first outer diameter, a first inner diameter, and a first recess extending a first distance from the first inner diameter toward the first outer diameter;
a second plate having a second outer diameter, a second inner diameter, and a second recess extending a second distance from the second inner diameter toward the second outer diameter; and
a plurality of mating features associated with the first plate and second plate, wherein the plurality of mating features are configured to selectively fix a position of a first workpiece between the first plate and second plate within the first recess and second recess, wherein the first outer diameter is associated with a diameter of a second workpiece, and wherein a diameter of the first workpiece is less than the diameter of the second workpiece.

2. The workpiece carrier of claim 1, wherein the diameter of the first workpiece is approximately 100 mm and the diameter of the second workpiece is approximately 150 mm.

3. The workpiece carrier of claim 1, wherein the first distance and second distance are associated with an exclusionary zone of the first workpiece.

4. The workpiece carrier of claim 1, wherein the first plate and second plate are comprised of one or more of graphite, silicon carbide, alumina, and quartz.

5. The workpiece carrier of claim 4, wherein the first plate and second plate are comprised of different materials.

6. The workpiece carrier of claim 1, wherein the first plate and second plate are comprised of material that is structurally stable at temperatures greater than approximately 700 C.

7. The workpiece carrier of claim 1, wherein the first recess of the first plate and second recess of the second plate are configured to contact an exclusionary zone around a perimeter of the first workpiece.

8. The workpiece carrier of claim 7, wherein a combination of a depth of the first recess and second recess is less than a thickness of the first workpiece.

9. The workpiece carrier of claim 7, wherein a combination of a depth of the first recess and second recess is greater than a thickness of the first workpiece.

10. A workpiece carrier, comprising:
a first plate having a first outer diameter, a first inner diameter, and a first recess extending a first distance from the first inner diameter toward the first outer diameter;
a second plate having a second outer diameter, a second inner diameter, and a second recess extending a second distance from the second inner diameter toward the second outer diameter; and
a plurality of mating features associated with the first plate and second plate, wherein the plurality of mating features are configured to selectively fix a position of a first workpiece between the first plate and second plate within the first recess and second recess, wherein the plurality of mating features comprise a plurality of pins extending from a bottom surface of the second plate and a plurality of holes extending into a top surface of the first plate.

11. A workpiece carrier, comprising:
a first plate having a first outer diameter, a first inner diameter, and a first recess extending a first distance from the first inner diameter toward the first outer diameter;
a second plate having a second outer diameter, a second inner diameter, and a second recess extending a second distance from the second inner diameter toward the second outer diameter; and
a plurality of mating features associated with the first plate and second plate, wherein the plurality of mating features are configured to selectively fix a position of a first workpiece between the first plate and second plate within the first recess and second recess, wherein the plurality of mating features comprise a plurality of ears extending from the second outer diameter of the second plate and a plurality of slots extending into a top surface of the first plate.

12. A workpiece carrier, comprising:
a first plate having a first outer diameter, a first inner diameter, and a first recess extending a first distance from the first inner diameter toward the first outer diameter;
a second plate having a second outer diameter, a second inner diameter, and a second recess extending a second distance from the second inner diameter toward the second outer diameter; and
a plurality of mating features associated with the first plate and second plate, wherein the plurality of mating features are configured to selectively fix a position of a first workpiece between the first plate and second plate within the first recess and second recess, wherein the first plate is configured to be selectively gripped about the first outer diameter thereof by a robotic gripper.

13. The workpiece carrier of claim 12, wherein at least a portion of the second plate is configured to be selectively gripped about the second outer diameter thereof by the robotic gripper.

14. A semiconductor processing system for processing a first workpiece and a second workpiece, wherein a diameter of the first workpiece is less than a diameter of the second workpiece, the semiconductor processing system comprising:
a process chamber having a process environment associated therewith;
a workpiece carrier for supporting the first workpiece, the workpiece carrier comprising:
a first plate having a first outer diameter, a first inner diameter, and a first recess extending a first distance from the first inner diameter toward the first outer diameter;
a second plate having a second outer diameter, a second inner diameter, and a second recess extending a second distance from the second inner diameter toward the second outer diameter; and
a plurality of mating features associated with the first plate and second plate, wherein the plurality of mating features are configured to selectively fix a position of the first workpiece between the first plate and second plate within the first recess and second recess;
a chuck positioned within the process chamber, wherein the chuck is configured to selectively grip either of the workpiece carrier and a second workpiece, based on whether the first workpiece or second workpiece is being processed.

15. The semiconductor processing system of claim 14, further comprising an ion implantation apparatus, wherein the ion implantation apparatus is configured to provide a plurality of ions to one of the first workpiece and second workpiece positioned in the process chamber.

16. The semiconductor processing system of claim 15, wherein the ion implantation apparatus comprises:
an ion source configured to form an ion beam;
a beamline assembly configured to mass analyze the ion beam; and
an end station comprising the process chamber.

17. The semiconductor processing system of claim 14, further comprising a load lock chamber operably coupled to the process chamber, wherein the load lock chamber is configured to isolate a process environment within the process chamber from an external environment.

18. The semiconductor processing system of claim 14, further comprising a robotic gripper, wherein the first plate is configured to be selectively gripped about the first diameter thereof by the robotic gripper.

19. The semiconductor processing system of claim 18, wherein at least a portion of the second plate is configured to be selectively gripped about the second diameter thereof by the robotic gripper.

20. The semiconductor processing system of claim 18, further comprising a load lock chamber operably coupled to the process chamber, wherein the robotic gripper is operably coupled to a vacuum robot positioned within the process chamber, and wherein the vacuum robot is configured to transfer either of the workpiece carrier and second workpiece within the process chamber and/or into and out of the load lock chamber.

21. The semiconductor processing system of claim 18, further comprising a load lock chamber operably coupled to the process chamber, wherein the robotic gripper is operably coupled to an atmospheric robot positioned outside of the process chamber, and wherein the atmospheric robot is configured to transfer either of the workpiece carrier and second workpiece into, and/or out of a load lock chamber.

22. The semiconductor processing system of claim 21, wherein the robotic gripper is further configured to transfer the first workpiece between a workpiece transport container and the workpiece carrier.

23. The semiconductor processing system of claim 14, wherein the chuck comprises a controlled temperature chuck.

24. The semiconductor processing system of claim 23, wherein the controlled temperature chuck comprises one of a sub-ambient temperature chuck and super-ambient chuck.

25. The semiconductor processing system of claim 14, wherein the chuck comprises an electrostatic chuck.

26. A method for processing a first workpiece and a second workpiece within a semiconductor processing system, wherein a diameter of the first workpiece is less than a diameter of the second workpiece, the method comprising:
   determining whether the first workpiece or second workpiece is to be processed;
   positioning the first workpiece in a first recess of a first plate when the first workpiece is to be processed, wherein the first plate has a first outer diameter associated with a diameter of the second workpiece, and wherein the first plate has a first inner diameter, wherein the first recess extends a first distance from the first inner diameter toward the first outer diameter;
   positioning over the first plate a second plate having a second outer diameter, a second inner diameter, and a second recess extending a second distance from the second inner diameter toward the second outer diameter, wherein a position of the first workpiece is generally fixed between the first plate and second plate within the first recess and second recess, and wherein a plurality of mating features associated with the first plate and second plate further selectively fix the position of the first workpiece between the first plate and second plate; and
   selectively gripping the first outer diameter of the first plate or a perimeter of the second workpiece, based on whether the first workpiece or second workpiece is to be processed.

27. The method of claim 26, further comprising transferring one of the first plate and second workpiece to a chuck positioned within a process chamber, based on whether the first workpiece or second workpiece is to be processed.

28. The method of claim 27, further comprising selectively gripping the one of the first plate and second workpiece via the chuck.

29. The method of claim 28, wherein selectively gripping the one of the first plate and second workpiece via the chuck comprises electrostatically gripping the one of the first plate and second workpiece to the chuck.

30. The method of claim 28, wherein selectively gripping the one of the first plate and second workpiece via the chuck comprises mechanically clamping the one of the first plate and second workpiece to the chuck.

\* \* \* \* \*